United States Patent [19] [11] 3,863,179
Goo [45] Jan. 28, 1975

[54] ULTRA LOW POWER AND ULTRA STABLE ASTABLE MULTIVIBRATOR

[75] Inventor: Gee In Goo, Silver Spring, Md.

[73] Assignee: The United States of America as represented by the Secretary of the Navy, Washington, D.C.

[22] Filed: Nov. 28, 1973

[21] Appl. No.: 419,752

[52] U.S. Cl. .............. 331/108 D, 307/279, 331/111
[51] Int. Cl. .......................................... H03k 3/282
[58] Field of Search ............ 331/108, 111; 307/304, 307/279

[56] References Cited
OTHER PUBLICATIONS
RCA "Digital Integrated Circuits" Mar. 1971, Pgs. 353–360.

Electronic Engineering, Dec. 1973 Page 13.

*Primary Examiner*—John Kominski
*Attorney, Agent, or Firm*—R. S. Sciascia; J. A. Cooke; Sol Sheinbein

[57] ABSTRACT

A COS/MOS multivibrator oscillator utilizing RCA CD4007 chips. A resistor located in the first buffer stage eliminates large current drain currently encountered during transition periods.

2 Claims, 2 Drawing Figures

ULTRA LOW POWER AND ULTRA STABLE ASTABLE MULTIVIBRATOR

BACKGROUND OF THE INVENTION

This invention relates to solid state timing devices and more particularly to an oscillator of COS/MOS components.

Timing devices for producing an electrical output after a substantial length of time are well known. In many instances these take the form of mechanical devices which are quite bulky and costly and which in many instances will not withstand the severe environments to which they may be exposed. Tuning forks are used in vibration free environments but shocks of large amplitudes present difficulties. The stability of a crystal timing oscillator is dependent on the environmental temperatures and operates at too high a frequency. Previous electrical devices for producing extended delays have likewise been excessively large and required large power to supply the required energy for the electrical components of the system.

SUMMARY OF THE INVENTION

Accordingly, the present invention provides an electrical oscillator which overcomes these and other disadvantages through the utilization of integrated circuit components which are of relatively small size and weight and which operate on a minimum of power for extended periods of time. The basic timer construction takes the form of stages of COS/MOS RCA CD 4007 integrated circuit chips, with a resistor placed in the first stage to reduce the current drain during transition periods.

It is therefore an object of the present invention to provide a precise and rugged timing oscillator at extremely low power and low cost.

Another object of the present invention is to provide an extremely accurate, highly stable, timing oscillator over large temperature ranges.

Yet another object of the present invention is to provide a low cost, low frequency, low power solid state timing device.

A still further object of the present invention is to provide a solid state timer in which the solid state components require a minimum of energy to operate.

These and other objects and advantages of the invention will become apparent by referring to the following description and claims taken in conjunction with the accompanying drawings, in which:

DESCRIPTION OF THE PREFERRED EMBODIMENTS

Figure 1:
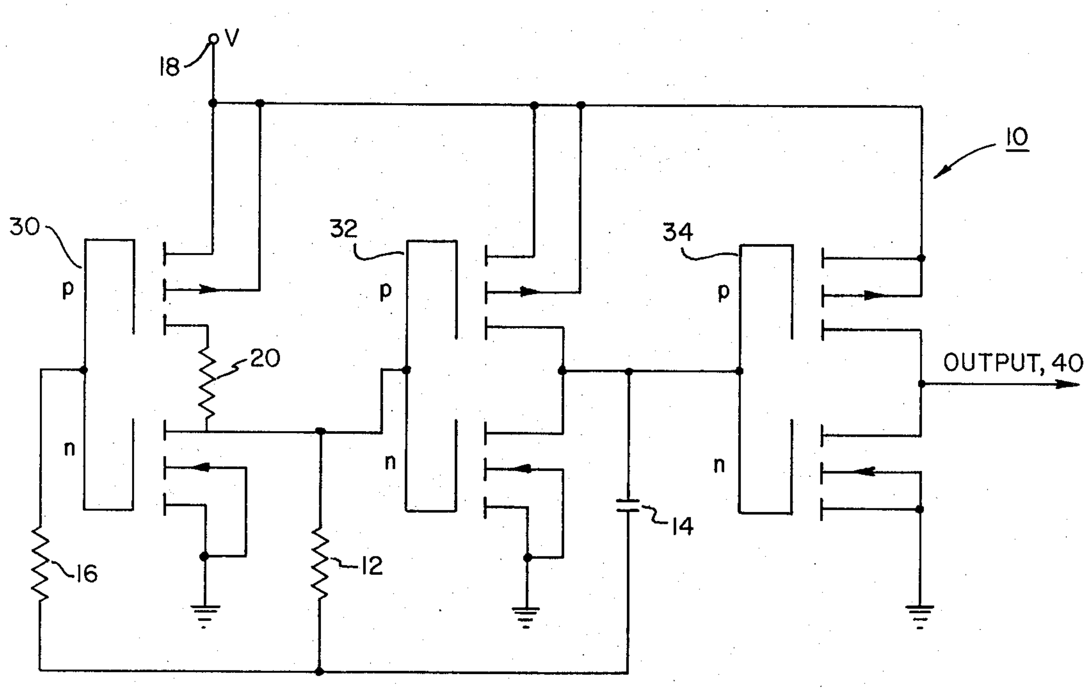
FIG. 1 is a functional diagram of the timing circuit in accordance with an embodiment of the present invention.

Referring now to the drawings wherein like numbers represent the same components in each figure, FIG. 1 is a block diagram of the oscillator according to the teachings of this invention. Oscillator 10 forms a time base supplying output 40 clock pulses. The oscillator 10 utilizes complementary symmetry metal oxide silicon RCA CD4007 integrated circuit chips (or gates) 30, 32, 34, or devices equivalent to them. The RC time constant of resistor 12 and capacitor 14 control the frequency of oscillation, with feedback resistor 16 stabilizing the variation in the frequency of oscillator 10. A more complete description of the operation of the RCA CD4007 chip may be found at pages 89–100 of the RCA COS/MOS IC Manual, RCA Corporation, 1972, the disclosure of which is incorporated herein by reference. To prevent large current during the transition period (when both the p-channel and n-channel transistors are "on") from voltage source 18 to ground, a large resistor 20, on the order of 1 Megohm, is inserted in the first stage of the oscillator 10 between the p channel and the n channel.

Figure 2:
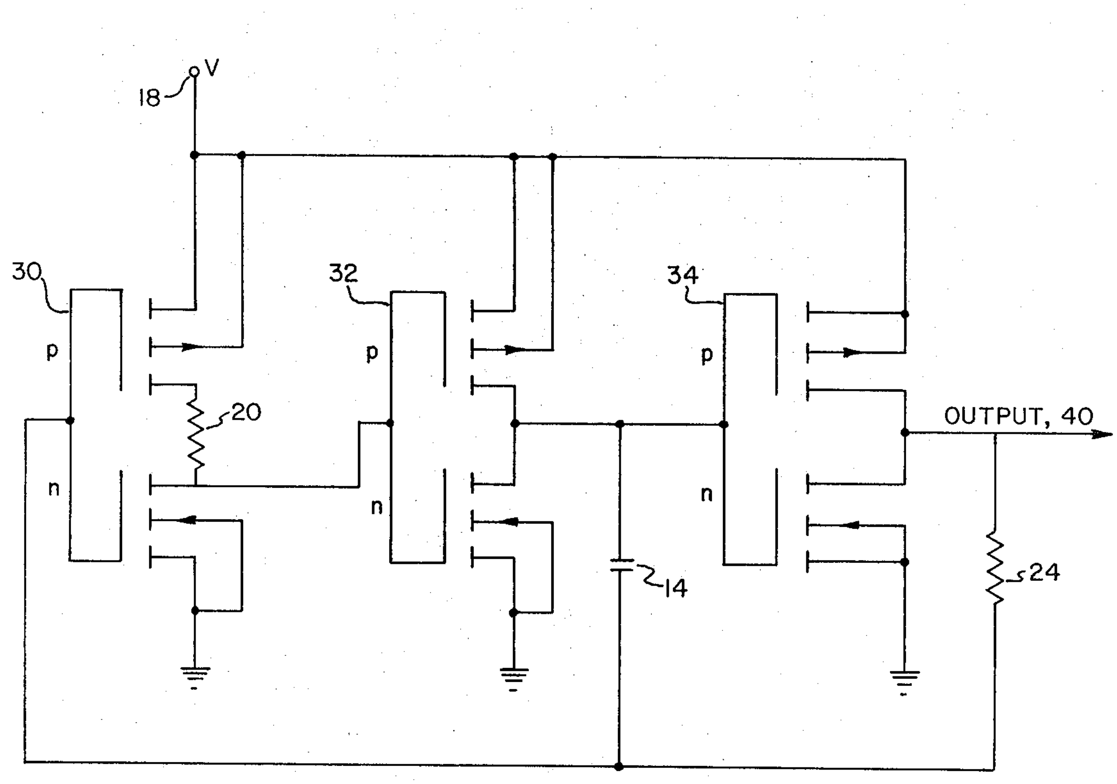
FIG. 2 illustrates a functional diagram of the timing circuit in accordance with a second embodiment of the present invention.

In an alternative embodiment as illustrated in FIG. 2, resistor 16 and resistor 12 are replaced by resistor 24 at the output of the third stage, reducing the current drain even further and enabling the oscillator to operate at very low frequency, i.e., 1 pulse per hour.

It is apparent from the above that the present invention provides an improved and simplified oscillator circuit. The high accuracy of 99.99% over temperature ranges from −30°C to +35°C, low cost, small size and few components and low frequency surpasses previous existing timing oscillators. The low power of less than 1 percent of that required for crystal oscillators, (0.5 $\mu$a) operation make it particularly adapted for mine timing mechanisms as well as related applications where detonator or signal or control circuits must be closed after a predetermined time of substantial duration.

Although the invention has been described in its preferred form with a certain degree of particularity, it is understood that the present disclosure of the preferred forms has been made only by way of example and that numerous changes in the details of construction and the combination and arrangement of parts may be resorted to without departing from the spirit and scope of the invention as hereinafter claimed.

What is claimed as new and desired to be secured by Letters Patent of the United States is:

1. A COS/MOS oscillator comprising:

a plurality of gates of complementary symmetry metal oxide silicon devices coupled to one another and arranged in an oscillator configuration;

a resistor-capacitor combination coupled to said gates for controlling the frequency of oscillation of said oscillator; and a large resistor on the order of 1 megohm in the first gate of said COS/MOS devices between the p channel transistor and n channel transistor for substantially reducing current drain when both transistors of said first gate are on.

2. An oscillator as recited in claim 1 wherein said resistor of said resistor-capacitor is at the output of the last gate of said COS/MOS devices to further reduce the current drain of said oscillator.

* * * * *